United States Patent

Izumi et al.

[11] Patent Number: 5,821,155
[45] Date of Patent: Oct. 13, 1998

[54] METHOD OF GROWING N-TYPE III-V SEMICONDUCTOR MATERIALS ON A SUBSTRATE USING $SiI_4$

[75] Inventors: Shigekazu Izumi; Yutaka Uneme, both of Tokyo, Japan

[73] Assignee: Mitsubishi Denki Kabushiki Kaisha, Tokyo, Japan

[21] Appl. No.: 747,664

[22] Filed: Nov. 13, 1996

[30] Foreign Application Priority Data

Dec. 20, 1995 [JP] Japan .................................... 7-332097

[51] Int. Cl.$^6$ .................................................. C30B 29/40
[52] U.S. Cl. ........................................... 438/479; 117/104
[58] Field of Search .................... 438/479, 505; 117/104

[56] References Cited

U.S. PATENT DOCUMENTS

| | | | |
|---|---|---|---|
| 4,664,940 | 5/1987 | Bensoussan et al. | 204/192.1 |
| 5,171,704 | 12/1992 | Abernathy et al. | 437/81 |
| 5,354,584 | 10/1994 | Schmidt | 427/530 |
| 5,580,382 | 12/1996 | Jackson et al. | 117/104 |

FOREIGN PATENT DOCUMENTS 60-86274  5/1985  Japan .

OTHER PUBLICATIONS

Izumi et al., "Chemical Beam Epitaxial Growth of Si–Doped GaAs And InP By Using Silicon Tetraiodide", Applied Physics Letters, vol. 68, No. 22, pp. 3102–3104, May 27, 1996.

Jackson et al., "High–Efficiency Silicon Doping Of InP And $In_{0.53}Ga_{0.47}As$ In Gas Source And Metalorganic Molecular Beam Epitaxy Using Silicon Tetrabromide", Applied Physics Letters, vol. 64, No. 21, May 1994, pp. 2867–2869.

Weyers et al., "Gaseous Dopant sources In MOMBE/CBE", Journal of Crystal Growth, vol. 105, 1990, pp. 383–392.

Abernathy et al., "Sn Doping Of GaAs And AlGaAs By MOMBE Using Tetraethylene", Journal of Crystal Growth, vol. 113, 1991, pp. 412–416.

Izumi et al., "Selective Area Chemical Beam Epitaxial Regrowth Of Si–Doped GaAs And InP By Using Silicon Tetraoxide For HFET Application", Ninth Annual Conference on Molecular Beam Epitaxy Aug. 1996, Malibu California.

J.D. Grange, in The Technology and Physics of Molecular Beam Epitaxy, edited by E.H.C. Parker, Plenum Press, p. 48 (no month given) 1985.

*Primary Examiner*—Charles L. Bowers, Jr.
*Assistant Examiner*—Keith Christianson
*Attorney, Agent, or Firm*—Leydig, Voit & Mayer

[57] ABSTRACT

A method of doping a compound semiconductor layer n-type during epitaxial growth of the compound semiconductor layer includes supplying source materials including respective elements of a compound semiconductor material to a heated monocrystalline substrate, epitaxially growing a layer of the compound semiconductor material on the heated substrate and, simultaneously, supplying $SiI_4$ as a dopant source material including silicon to the heated substrate, incorporating silicon as a dopant impurity producing n-type conductivity into the compound semiconductor layer during the epitaxial growth.

13 Claims, 5 Drawing Sheets

METHOD OF GROWING N-TYPE III-V SEMICONDUCTOR MATERIALS ON A SUBSTRATE USING SiI$_4$

FIELD OF THE INVENTION

This invention relates to doping a growing compound semiconductor crystalline layer with a dopant producing n-type conductivity and particularly to doping with silicon.

BACKGROUND OF THE INVENTION

In order to produce an n-type crystalline compound semiconductor layer, such as GaAs or InP, the source of a dopant producing n-type conductivity in the grown layer is conventionally supplied during the growth process. For example, when the dopant producing n-type conductivity is silicon, the source of the silicon may be a gaseous compound of silicon such as silane (SiH$_4$) or disilane (Si$_2$H$_6$). The dopant source gas is decomposed during the growth process, producing elemental silicon that is incorporated into the growing crystalline layer as a dopant.

In general, the dopant source is thermally decomposed at the surface of the growing layer to produce the dopant atoms, such as silicon atoms. The quantity of silicon atoms produced in decomposing the dopant source depends upon a number of factors, such as the temperature of the substrate on which the layer is growing, i.e., the amount of thermal energy supplied to the dopant source material. Since it is desirable to control the substrate temperature for other purposes, such as controlling the rate of growth of the crystalline layer, elimination of doping dependence on the substrate temperature is desired. Accordingly, a dopant source material with a minimum bonding energy, i.e., the minimum energy needed to decompose the dopant source material to produce dopant atoms, is desired.

If the decomposition rate of the dopant source material is independent of substrate temperature, then the amount of dopant produced for incorporation in the growing crystalline layer is proportional only to the flow rate of that dopant source material. However, according to experience, because of the bonding energy between silicon and hydrogen atoms in disilane, the quantity of silicon that is produced when disilane is thermally decomposed depends very significantly on the temperature of the substrate, making independent control of the dopant concentration and the growing layer very difficult. Likewise, it is preferable that the amount of dopant available not depend on the ratio of the source material providing the Group V atoms of the growing layer to the source material providing the Group III of the growing crystalline layer (hereafter the V/III ratio), when the grown layer is a III–V compound semiconductor such as GaAs.

FIG. 5 is a graph of the relationship between the growth temperature of a substrate on which a GaAs layer is being grown and the charge carrier concentration in the grown layer based upon silicon doping. In this example, the layer is grown by chemical beam epitaxy (CBE) with triethylgallium as the source of gallium, arsine (AsH$_3$) as the source of arsenic, and disilane as the source of silicon. As indicated in the figure, the charge carrier concentration of the grown layer is a linear function of the temperature of the substrate. From the slope of the line drawn in FIG. 5, the activation energy of the disilane is determined to be 0.83 eV, a relatively high activation energy indicating that the amount of doping achieved is strongly dependent on the temperature of the substrate.

In addition, the dopant concentration is proportional to the disilane flow rate until the dopant concentration reaches $10^{18-3}$. However, as the flow rate of disilane is increased, increasing the quantity of dopant gas supplied per unit time, the background pressure in the CBE apparatus increases and becomes too high for the epitaxial growth to proceed as desired in the area where beams of the source materials converge. Moreover, the dopant concentration depends heavily on the V/III ratio and the doping efficiency is reduced at high V/III ratios. For these reasons, disilane has not been an appropriate dopant source material, especially for doping InP and InGaP, which require relatively high dopant concentrations and low growth temperatures.

SUMMARY OF THE INVENTION

The invention solves the doping problems experienced in the prior art and has as its object the provision of a doping method in which the concentration of a dopant incorporated in a growing compound semiconductor layer has little dependence upon the temperature of the substrate on which the layer is being grown and, therefore, in which the dopant concentration is easily controlled.

According to a first aspect of the invention, a method of doping a compound semiconductor layer n-type during epitaxial growth of the compound semiconductor layer comprises supplying source materials including respective elements of a compound semiconductor material to a heated monocrystalline substrate, thereby epitaxially growing a layer of the compound semiconductor material on the heated substrate and, simultaneously, supplying SiI$_4$ as a dopant source material including silicon to the heated substrate, thereby incorporating into the compound semiconductor layer during the epitaxial growth silicon as a dopant impurity producing n-type conductivity.

According to another aspect of the invention, a carrier gas is used to supply the SiI$_4$ to the substrate.

Further, the compound semiconductor material may be GaAs, InGaAs, InP, or InGaP.

The source materials for the compound semiconductor material may be metal-organic compounds and hydrides. The growth process used may be metal-organic chemical vapor deposition, chemical beam epitaxy, or molecular beam epitaxy.

The method produces compound semiconductor layers with dopant concentrations independent of substrate temperature during epitaxial growth of the layers, with reduced dopant source gas flow rates, and increased doping efficiency.

DESCRIPTION OF PREFERRED EMBODIMENTS

Figure 1:
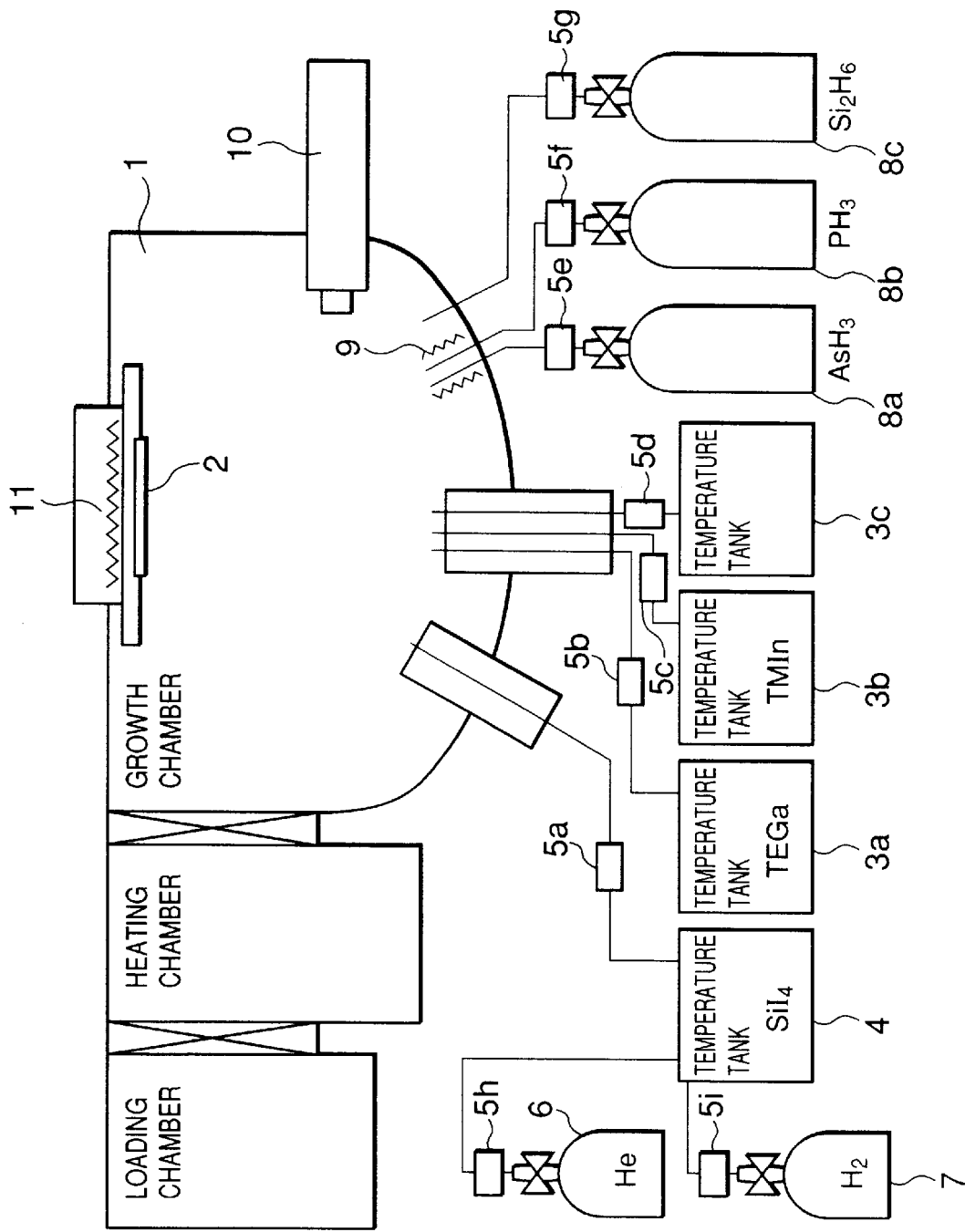
FIG. 1 is schematic diagram illustrating a CBE apparatus that may be employed in practicing the invention.

FIG. 1 is a schematic diagram illustrating a CBE apparatus that may be employed to practice the method according to the invention. The CBE apparatus includes a growth chamber 1 housing a substrate 2, that may be an n-type GaAs substrate, on which a compound crystalline semiconductor layer is grown. A heater 11 heats the substrate 2, providing thermal energy for decomposing source gases. Respective metal-organic compounds are supplied from corresponding temperature controlled tanks 3a, 3b, and 3c. For example, triethylgallium (TEGa) and trimethylindium (TMIn) may be supplied from temperature controlled tanks 3a and 3b, respectively, the pressure within each tank being determined by the temperature of the tank. A temperature controlled tank 4 supplies $SiI_4$. The rates of flow of gases from the tanks 4 and 3a, 3b, and 3c are respectively monitored by flow meters 5a, 5b, 5c, and 5d. A chemically inactive carrier gas, such as helium or hydrogen, is supplied from tanks 6 and 7 to tank 4. Helium is usefully employed to introduce $SiI_4$ into the chamber 1 and is shown connected directly to the tank 4 through a flow meter 5h. The hydrogen tank 7 is likewise connected through a flow meter 5i directly to the temperature controlled tank 4 containing $SiI_4$. Gaseous hydrides, namely $AsH_3$, $PH_3$, and $Si_2H_6$ are supplied from respective tanks 8a, 8b, and 8c through respective flow meters 5e, 5f, and 5g. These hydrides may flow through pipes including heaters 9 that heat the hydrides in order to initiate their decomposition in advance of their interaction with other source gases in the chamber 1. Finally, a mass spectrometer 10 monitors the composition of the gaseous ambient within the chamber 1.

In the illustrated CBE apparatus, each metal-organic compound, such TEGa within a pressure controlled tank can have its temperature controlled to increase the pressure in the tank above the minimum pressure required for control of the flow of the gaseous compound by the respective flow meter. Using the temperature control, the flow rate of the metal-organic compound can be controlled without using a carrier gas, i.e., using only the corresponding flow meter. Thus, the gaseous compound can travel by itself to the vicinity of the substrate 2 within the growth chamber 1 without a carrier gas that would increase the background pressure in the growth chamber 1. Maintaining a relatively low pressure within the growth chamber 1 is desired in order to ensure a sufficiently long mean free path so that the molecules of the metal-organic compound reach the vicinity of the substrate 2. In this operating regime, the CBE apparatus essentially produces molecular beams that are incident on the substrate 2.

In a method according to the invention, the CBE apparatus is used to supply silicon as a dopant to a growing n-type GaAs layer, grown on the substrate 2, using $SiI_4$ as a dopant source. In this example, TEGa is used as the source of the Group III element and arsine is employed as the source of the Group V element of the epitaxially grown GaAs layer. TEGa in a bubbler is held in the temperature controlled tank 3a. The temperature of the tank 3a is raised to 80° C. so that the vapor pressure of the TEGa is at least 10 Torr. A temperature of at least 35° C. is required to produce sufficient pressure so that the flow meter 5b accurately measures the flow rate of the TEGa. The $SiI_4$ dopant source is introduced into the growth chamber 1 using helium as a carrier gas. Arsine is supplied from the tank 8a. The metal-organic molecules, the hydride gas, and the dopant source are injected into the chamber 1 toward the substrate 2 heated by the heater 11. A layer of GaAs is grown on the substrate 2. The $SiI_4$ dopant source is decomposed at the surface of the substrate 2 and the growing layer by the thermal energy supplied from the heated substrate. An n-type layer is produced due to the incorporation of silicon as a dopant in the growing GaAs layer.

Figure 2:
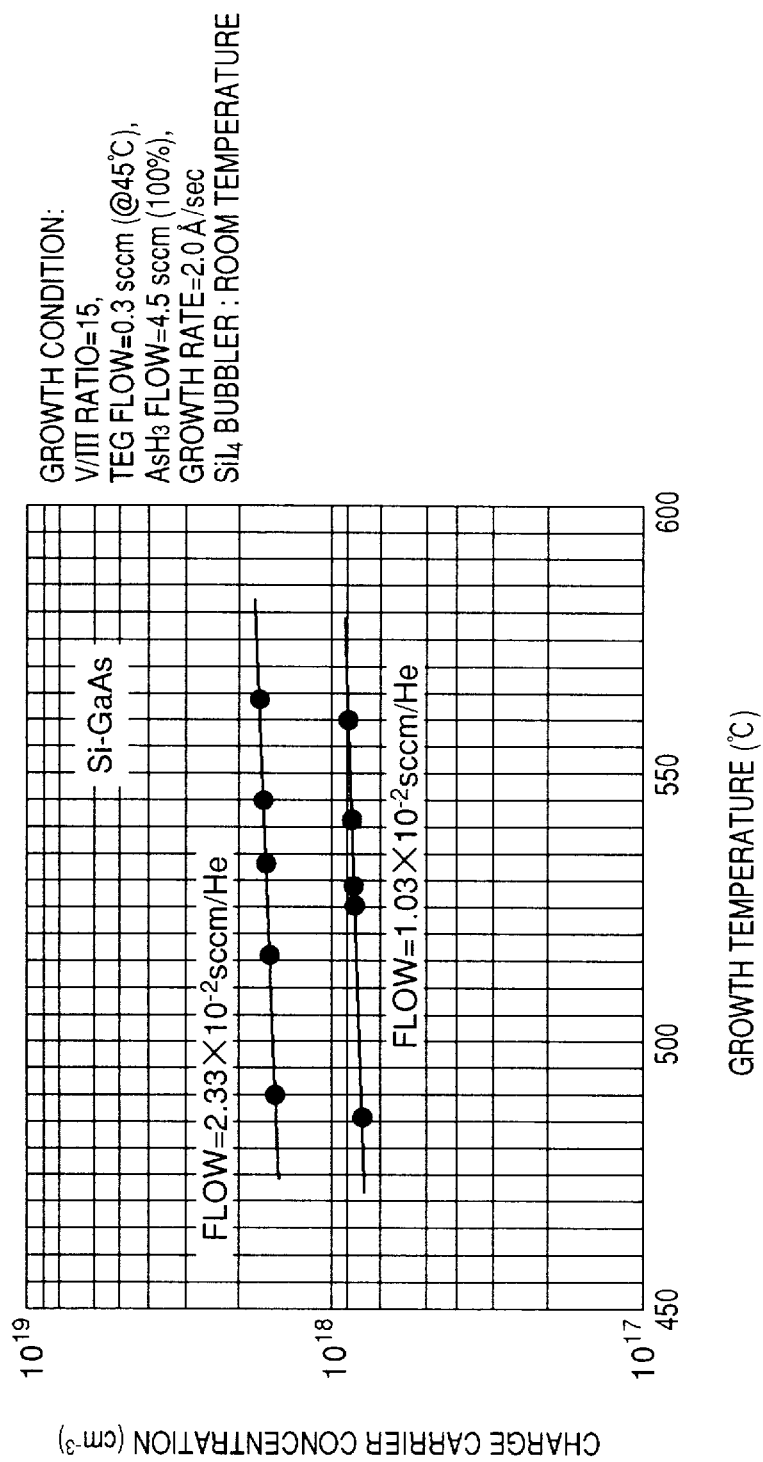
FIG. 2 is a graph showing charge carrier concentration as a function of substrate temperature for silicon doped n-type GaAs layers grown using SiI$_4$ as a dopant source material.
Figure 5:
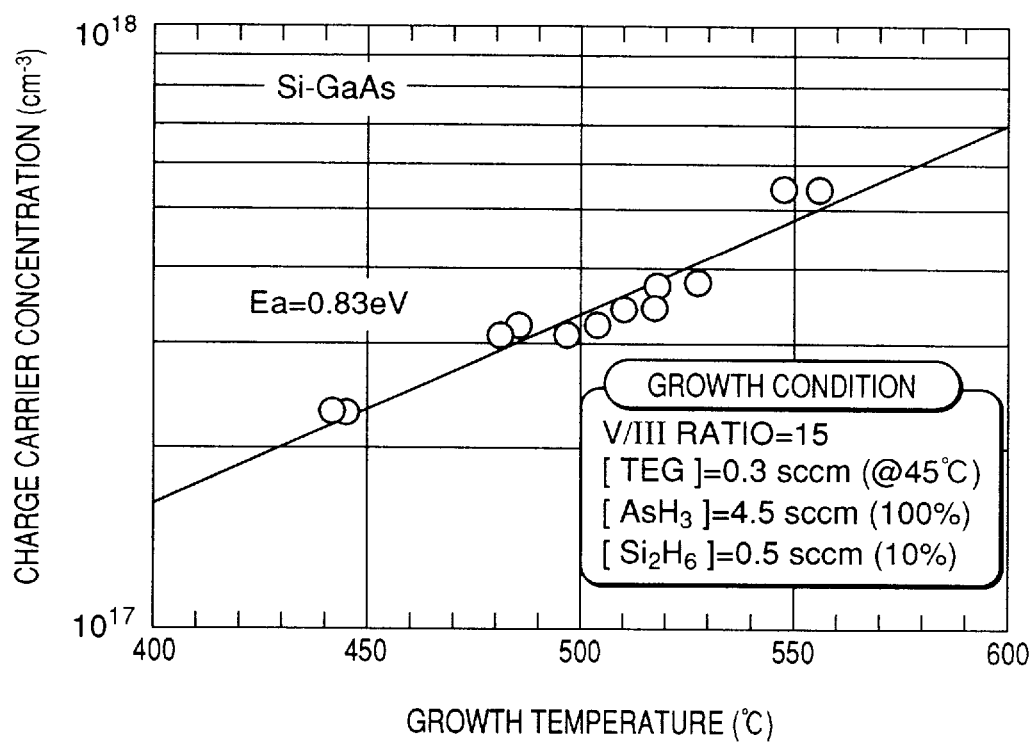
FIG. 5 is a graph showing charge carrier concentration as a function of substrate temperature for n-type GaAs layers grown using Si$_2$H$_6$ as a dopant source gas.

Silicon doped GaAs layers grown as described were evaluated in several ways. FIG. 2 is graph showing the charge carrier concentration in grown layers as a function of the temperature of the substrate 2 during the growth of the layers. FIG. 2 shows that when the dopant source $SiI_4$ is transported with helium as a carrier gas, the charge carrier concentration in the grown layer varies little with the temperature of the substrate during the growth process and varies far less than when the dopant source is disilane. The difference in the dependencies of charge carrier concentration on substrate temperature is apparent when FIG. 2 is compared to FIG. 5, showing the results of similar experiments using disilane as the dopant source.

Figure 3:
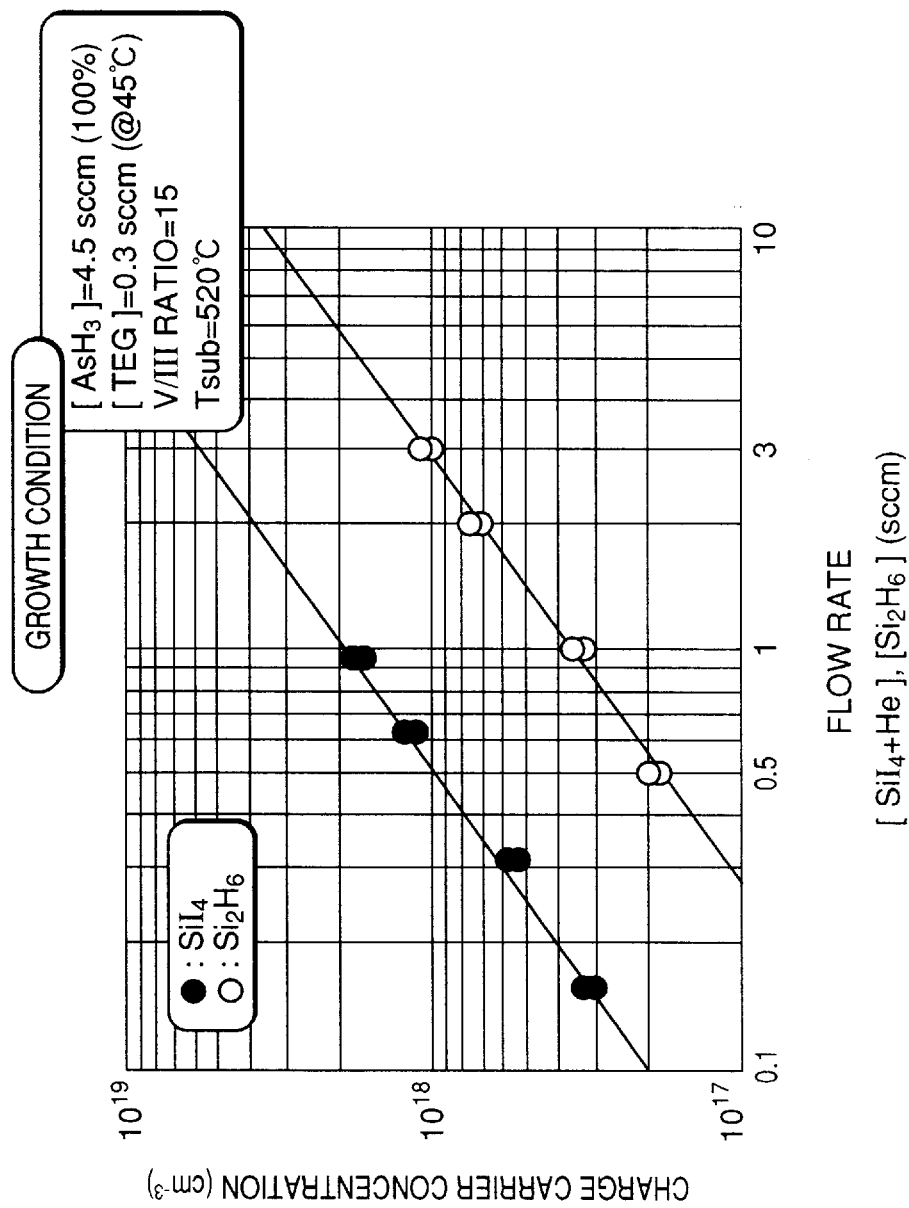
FIG. 3 is a graph showing the respective charge carrier concentrations in n-type GaAs layers doped with silicon as a function of the sum of the flows of a carrier gas and a dopant source gas for SiI$_4$ and Si$_2$H$_6$ as respective dopant source gases.

FIG. 3 is a graph showing charge carrier concentration in grown n-type GaAs layers when each of $SiI_4$ and disilane are used as dopant source gases during respective growth processes. The measured characteristics for grown layers are plotted separately for the two different dopant sources. The data plotted are for experiments carried out with the temperature of the substrate on which the layer was grown set to about 520° C. The two lines in FIG. 3 show that to achieve a charge carrier concentration of $2\times10^{18} cm^{-3}$, the total of the flow rates of $SiI_4$ and the helium carrier gas needs to be only about 20% of the flow rate of disilane. Thus, in the CBE process, the background pressure can be kept lower using $SiI_4$ as a dopant source, even in combination with a carrier gas, than when disilane is used as a dopant source.

Figure 4:
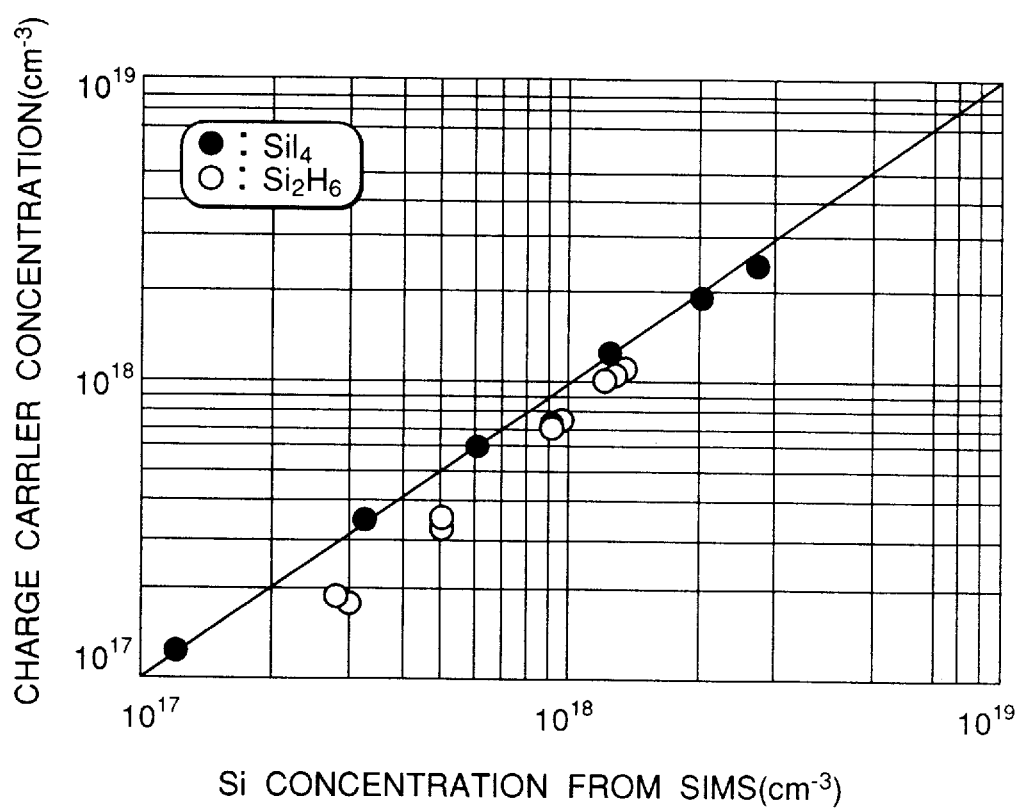
FIG. 4 is a graph of the relationship between silicon concentration and charge carrier concentration in n-type GaAs layers grown with SiI$_4$ and Si$_2$H$_6$ as respective dopant source gases.

FIG. 4 is a graph showing the relationship between the charge carrier concentration in n-type GaAs layers doped with silicon and grown when $SiI_4$ and disilane are separately used as dopant source gases, as a function of the silicon concentration in the grown layers. The amount of silicon incorporated into the grown layers was measured by secondary ion mass spectroscopy (SIMS). FIG. 4 shows that when the dopant source was $SiI_4$, almost 100% of the silicon incorporated into the growing crystalline semiconductor layer was activated and functioned as a dopant. When the dopant source was disilane, the activation ratio of the incorporated silicon was no more than 80% so that a substantial amount of inactive silicon was incorporated into the grown n-type GaAs crystalline layer.

The measured results reported in FIGS. 2–4 demonstrate the desirability of using $SiI_4$ as a source of silicon as a dopant producing n-type conductivity in an epitaxially grown compound semiconductor layer. The amount of silicon incorporated in the grown layer is relatively independent of the temperature of the substrate on which the epitaxial layer is grown. The total of the flow rates of the dopant source and the carrier gas to achieve a particular charge carrier concentration in a grown layer using $SiI_4$ plus helium is approximately one-fifth the flow rate of disilane used by itself. Further, when the dopant source is $SiI_4$ instead of disilane, a larger proportion of the incorporated silicon atoms are activated and function as dopant atoms providing higher doping efficiency.

Although a CBE apparatus has been referred to in connection with practicing the invention, the invention may also be employed with other epitaxial growth techniques such as metal-organic molecular beam epitaxy (MOMBE), gas source molecular beam epitaxy (GS-MBE), metal-organic chemical vapor deposition (MOCVD), and molecular beam epitaxy (MBE). These methods are briefly described below.

MBE is performed in an ultra-high vacuum. Molecular beam cells as sources of the elements of the crystalline layer to be epitaxially grown are mounted on an ultra-high vacuum chamber. The source materials may be molecular compounds of the elements of the compound semiconductor layer or may be atomic sources of one or more of those elements. The cells are heated to produce molecular or atomic vapors of the source materials. The vapors irradiate a heated substrate within the ultra high vacuum chamber whereby a crystalline layer is epitaxially grown on the substrate. A vacuum of approximately $10^{-5}$ Torr is maintained in the growth chamber during the epitaxial growth process so that the mean free path of the vaporized source materials is relatively long and one or more molecular or atomic beams are formed, extending from the respective cells toward a substrate.

The planarity of the grown layer and of the interface with the substrate in this process is excellent because no chemical reaction contributes to the growth process. As a result, the growth speed, the thickness of the epitaxially grown layer, and the composition of the layer are all well controlled. However, since the molecular beam cells must be connected to the apparatus, there are problems with impurities in the molecular cells, particularly caused by the heating of the cells and the mounting and demounting of the cells. To avoid these problems, MOMBE and GS-MBE may be employed since those methods supply at least one of the source materials used in the growth process in a vapor phase.

In the MOCVD process, a metal-organic compound is thermally decomposed to release a metallic element that is a part of the epitaxially grown layer. In addition to the metal-organic compound that is one of the source gases, a hydride that contains an element of the epitaxially grown layer is also supplied, sometimes using a carrier gas, to the substrate on which the epitaxial growth occurs. The MOCVD process may be carried out over a relatively wide pressure range, from about $10^{-3}$ Torr up to atmospheric pressure, and may be used to grow layers of a wide variety of materials. Thus, the MOCVD process has many degrees of freedom but, since a chemical reaction must occur to produce the epitaxial growth, control of the growth speed is difficult and control of the thickness of grown layer is inferior to other methods.

The CBE process has characteristics intermediate those of MOCVD and MBE. In CBE, a metal-organic compound and a hydride are used to form respective molecular beams that react at a heated substrate to produce an epitaxially grown layer. Control of the thickness of the growing layer is better than in MOCVD.

The method of incorporating a dopant impurity producing n-type conductivity in an epitaxially grown layer during epitaxial growth according to the invention can be used in any of CBE, MOMBE, GS-MBE and MOCVD. The resultant dopant concentration can be more easily controlled than in prior art methods and the reliability of the doping process is improved.

According to the described example, $SiI_4$ is used as the dopant source for producing an n-type GaAs epitaxial layer. The resulting dopant concentration is not significantly affected by the temperature of the substrate during growth of the layer and depends almost only on the $SiI_4$ flow rate so that the dopant concentration is easily controlled. In addition, the flow rate of the $SiI_4$ is lower than that for disilane to achieve the same dopant concentration. Further, according to the invention, the dopant efficiency is improved, with nearly 100% dopant impurity activation. The resulting n-type GaAs epitaxial layers have highly stable dopant concentrations and provide excellent performance in high frequency electronic devices and optical devices, including the epitaxial layers.

The method according to the invention can also be applied to silicon doping, using $SiI_4$ as a dopant source, of InP grown by CBE. The CBE apparatus shown in FIG. 1 may be employed in this application of the invention. In this process, TMIn is the source material of the Group III element and $PH_3$ is the source material for the Group V element of the epitaxial layer. TMIn contained in a bubbler is held at a controlled temperature in the tank 3b to produce a desired pressure. For example, at 80° C., the vapor pressure of TMIn is at least 10 Torr. $SiI_4$ as a dopant source is introduced into the growth chamber 1 with helium as a carrier gas. Phosphine ($PH_3$) is supplied from a tank 8b. These three source materials are introduced into the growth chamber 1 in the direction of the substrate 2 heated by the heater 11. There, an InP layer incorporating silicon as a dopant impurity producing n-type conductivity is epitaxially grown on the substrate 2.

An epitaxially grown n-type InP layer was evaluated in the same manner that the n-type GaAs layer was evaluated. The charge carrier concentration in the epitaxially grown InP layer has a smaller variation with the temperature of the substrate during the epitaxial growth process than when disilane is used as the dopant source. As in the first embodiment, nearly 100% of the silicon incorporated in the epitaxially grown layer was activated and functioned as a dopant. Since n-type InP must be grown at a temperature of 520° C. or lower, when disilane is used as a dopant source, the disilane is not fully thermally decomposed, making it difficult to obtain a desired dopant concentration in the epitaxially grown InP layer. However, when $SiI_4$ is employed as the dopant source material, it is completely decomposed at the epitaxial growth temperature. Since essentially all of the silicon incorporated in the epitaxially grown InP layer is activated and functions as a dopant, an $SiI_4$ dopant source provides significantly improved results in growing n-type epitaxial InP layers.

The process for growing n-type InP layers according to the invention is not limited to the CBE process but may also be applied to the MOMBE, GSMBE, MOCVD, and MBE processes. Regardless of the particular process employed, n-type InP epitaxial layers that are highly stable and useful in electronic and optical devices are easily produced according to the invention.

According to another embodiment of the invention an n-type InGaP epitaxial layer incorporating silicon as dopant producing n-type conductivity may be grown using the CBE process. Again, the apparatus illustrated in FIG. 1 may be used to produce the epitaxially grown InGaP layer.

In this embodiment of the invention, TEGa and TMIn were simultaneously employed as sources of Group III elements for the grown layer and phosphine was employed as the source material for the Group V element. TEGa and TMIn in respective bubblers were placed in temperature controlled tanks 3a and 3b, respectively. The temperatures of these tanks 3a and 3b were raised, for example to 80° C., at which the vapor pressures of TEGa and TMIN are at least 10 Torr. $SiI_4$ is introduced into the growth chamber 1 using helium as a carrier gas. These four vapor phase source materials were introduced into the growth chamber 1 and reacted with the substrate 2 that was heated to an elevated temperature by the heater 11. An epitaxial layer of n-type InGaP was grown, incorporating silicon as a dopant impurity producing n-type conductivity.

The epitaxially grown n-type InGaP layer was evaluated using the same techniques described above. Again, the variation of charge carrier concentration in the grown layer with the temperature of the substrate during the growth process is smaller than the variation when disilane was employed as the dopant impurity source material. In the method according to the invention, nearly 100% of the silicon incorporated in the epitaxial InGaP layer was activated and functioned as a dopant impurity. Since n-type InGaP must be grown at a temperature of no more than 520° C., disilane is not fully decomposed at the growth temperature, making it difficult to obtain a desired dopant impurity concentration from disilane as a dopant source material. However, when the dopant impurity source material is $SiI_4$, the dopant source is completely decomposed at the epitaxial growth temperature.

Although this example again refers to a CBE process, the method according to the invention can also be applied to other epitaxial growth techniques, such as MOMBE, GS-MBE, MOCVD, and MBE, in epitaxially growing n-type InGaP. In addition, although helium is employed as the carrier gas in this embodiment, the carrier gas may be hydrogen.

In the invention, the dopant concentration in an epitaxially grown layer is easily controlled since it depends very little on the temperature of the substrate during growth and is principally controlled by the $SiI_4$ flow rate. N-type epitaxial InGaP layers produced according to this method are highly stable and provide good performance in electronic and optical devices that incorporate those layers.

According to another embodiment of the invention an n-type InGaAs epitaxial layer incorporating silicon as dopant producing n-type conductivity may be grown using the CBE process. Again, the apparatus illustrated in FIG. 1 may be used to produce the epitaxially grown InGaAs layer.

In this embodiment of the invention, TEGa and TMIn were simultaneously employed as sources of Group III elements for the grown layer and arsine was employed as the source material for the Group V element. TEGa and TMIn in respective bubblers were placed in temperature controlled tanks 3a and 3b, respectively. The temperatures of these tanks 3a and 3b were raised, for example to 80° C., at which the vapor pressures of TEGa and TMIn are at least 10 Torr. $SiI_4$ is introduced into the growth chamber 1 using helium as a carrier gas. These four vapor phase source materials were introduced into the growth chamber 1 and reacted with the substrate 2 that was heated to an elevated temperature by the heater 11. An epitaxial layer of n-type InGaAs was grown, incorporating silicon as a dopant impurity producing n-type conductivity.

The epitaxially grown n-type InGaAs layer was evaluated using the same techniques described above. Again, the variation of charge carrier concentration in the grown layer with the temperature of the substrate during the growth process is smaller than the variation when disilane was employed as the dopant impurity source material. In the method according to the invention, nearly 100% of the silicon incorporated in the epitaxial InGaAs layer was activated and functioned as a dopant impurity. Since n-type InGaAs must be grown at a temperature of no more than 520° C., disilane is not fully decomposed at the growth temperature, making it difficult to obtain a desired dopant impurity concentration from disilane as a dopant source material. However, when the dopant impurity source material is $SiI_4$, the dopant source is completely decomposed at the epitaxial growth temperature.

Although this example again refers to a CBE process, the method according to the invention can also be applied to other epitaxial growth techniques, such as MOMBE, GS-MBE, MOCVD, and MBE, in epitaxially growing n-type InGaAs. In addition, although helium is employed as the carrier gas in this embodiment, the carrier gas may be hydrogen.

In the invention, the dopant concentration in an epitaxially grown layer is easily controlled since it depends very little on the temperature of the substrate during growth and is principally controlled by the $SiI_4$ flow rate. N-type epitaxial InGaAs layers produced according to this method are highly stable and provide good performance in electronic and optical devices that incorporate those layers.

The invention has been described with respect to certain preferred embodiments. Various modifications and additions within the spirit of the invention will occur to those of skill in the art. Accordingly, the scope of the invention is limited solely by the following claims.

We claim:

1. A method of forming an n-type layer of a III–V semiconductor material on a substrate comprising:

heating a substrate in a chamber;

supplying a first gaseous compound including a Group III element to the chamber without using a carrier gas;

controlling the temperature of the first gaseous compound so that the vapor pressure of the first gaseous compound is at least 10 Torr;

supplying a second gaseous compound including a Group V element to the chamber simultaneously with supplying of the first gaseous compound; and supplying $SiI_4$, as a dopant source gas, with a carrier gas to the chamber simultaneously with supplying of the first and second gaseous compounds to the chamber.

2. The method of claim 1 including maintaining the dopant source gas at a constant temperature.

3. The method of claim 1 wherein the first gaseous compound is a metal-organic compound and the second gaseous compound is a hydride.

4. The method of claim 1 including supplying helium as the carrier gas for transporting the dopant source gas.

5. The method of claim 1 wherein the first gaseous compound is triethyl gallium and the second gaseous compound is arsine.

6. The method of claim 1 wherein the first gaseous compound is trimethyl indium and the second gaseous compound is phosphine.

7. The method of claim 1 wherein the first gaseous compound is a mixture of triethyl gallium and trimethyl indium and the second gaseous compound is phosphine.

8. A method of forming an n-type layer of a III–V semiconductor material on a substrate comprising:

heating a substrate in a chamber;

supplying a first gaseous compound including a Group III element to the chamber without using a carrier gas;

controlling the temperature of the first gaseous compound;

supplying a second gaseous compound including a Group V element to the chamber simultaneously with supplying of the first and second gaseous compounds; and supplying $SiI_4$, as a dopant source gas, with helium gas as a carrier gas, to the chamber simultaneously with supplying of the first and second gaseous compounds to the chamber, and maintaining the dopant source gas at a predetermined temperature.

9. The method of claim 8 wherein the temperature of the first gaseous compound is lower than 80° C. so that the vapor pressure of the first gaseous compound is at least 10 Torr.

10. The method of claim 8 wherein the first gaseous compound is a metal-organic compound and the second gaseous compound is a hydride.

11. The method of claim 8 wherein the first gaseous compound is triethyl gallium and the second gaseous compound is arsine.

12. The method of claim 8 wherein the first gaseous compound is trimethyl indium and the second gaseous compound is phosphine.

13. The method of claim 8 wherein the first gaseous compound is triethyl gallium and trimethyl indium and the second gaseous compound is phosphine.

* * * * *

UNITED STATES PATENT AND TRADEMARK OFFICE
CERTIFICATE OF CORRECTION

PATENT NO.   : 5,821,155
DATED        : October 13, 1998
INVENTOR(S)  : Izumi et al.

It is certified that error appears in the above-identified patent and that said Letters Patent is hereby corrected as shown below:

Column 8, Line 67, delete "and second";

Column 10, Line 9, change "compounds" to --compound--;

Line 9, before "triethyl" insert --a mixture of--.

Signed and Sealed this

Ninth Day of March, 1999

Attest:

Attesting Officer

Q. TODD DICKINSON

Acting Commissioner of Patents and Trademarks